United States Patent
Wu et al.

(10) Patent No.: US 11,428,722 B2
(45) Date of Patent: Aug. 30, 2022

(54) RESISTANCE TEST METHOD USING KELVIN STRUCTURE

(71) Applicant: Hua Hong Semiconductor (Wuxi) Limited, Wuxi (CN)

(72) Inventors: Hao Wu, Wuxi (CN); Bin Han, Wuxi (CN); Xudong Li, Wuxi (CN); Qiyi Yang, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 0 days.

(21) Appl. No.: 17/122,280

(22) Filed: Dec. 15, 2020

(65) Prior Publication Data
US 2021/0190843 A1    Jun. 24, 2021

(30) Foreign Application Priority Data
Dec. 18, 2019 (CN) .......................... 201911308124.5

(51) Int. Cl.
*G01R 31/26* (2020.01)
*G01R 27/08* (2006.01)

(52) U.S. Cl.
CPC .......... *G01R 27/08* (2013.01); *G01R 31/2601* (2013.01)

(58) Field of Classification Search
CPC .... G01R 27/08; G01R 27/26; G01R 31/2601; G01R 31/203; G01R 1/20; G01K 7/028; G01K 7/183; G01K 7/186
See application file for complete search history.

(56) References Cited

U.S. PATENT DOCUMENTS

| 5,721,688 A * | 2/1998 | Bramwell | ............ | G01R 31/007 324/426 |
| 6,362,638 B1 * | 3/2002 | Ashton | .................. | G01R 31/66 324/762.02 |
| 2003/0080766 A1 * | 5/2003 | Fetterman | ............. | H01L 23/544 324/719 |

FOREIGN PATENT DOCUMENTS

CN           106291116        *  1/2017

* cited by examiner

*Primary Examiner* — Thang X Le
(74) *Attorney, Agent, or Firm* — MKG, LLC

(57) ABSTRACT

The disclosure discloses a resistance test method using a Kelvin structure, which includes the following steps: step 1: providing a Kelvin test structure including a tested resistor, a first parasitic resistor, and a second parasitic resistor connected in series; step 2: applying first current to the two current test terminals and simultaneously testing first voltage in the two voltage test terminals; step 3: applying second current in a direction opposite to the direction of the first current to the two current test terminals and simultaneously testing second voltage in the two voltage test terminals; step 4: dividing a difference value obtained by subtracting the second voltage from the first voltage by a difference value between the first current and the second current to obtain the final test value of the tested resistor. The disclosure can reduce the resistance test error.

13 Claims, 4 Drawing Sheets

RESISTANCE TEST METHOD USING KELVIN STRUCTURE

CROSS-REFERENCES TO RELATED APPLICATIONS

This application claims priority to Chinese patent application number 201911308124.5 filed at CNIPA on Dec. 18, 2019, and entitled "RESISTANCE TEST METHOD USING KELVIN STRUCTURE", the disclosure of which is incorporated by reference herein its entirety.

TECHNICAL FIELD

The disclosure relates to a semiconductor integrated circuit test method, in particular to a resistance test method using a Kelvin structure.

BACKGROUND

There are many small resistors (with resistance usually less than 1 ohm) which need to be tested in semiconductors. Usually, a Kelvin structure, i.e., a four-terminal method, is used to test.

Referring to FIG. 1, it is a schematic diagram of an existing Kelvin test structure. The Kelvin test structure includes a tested resistor Rx, a first parasitic resistor Rc1 and a second parasitic resistor Rc2. A first end 3 of the tested resistor Rx is connected with a second end of the first parasitic resistor Rc1, and a second end 4 of the tested resistor Rx is connected with a first end of the second parasitic resistor Rc2.

The first end 3 and the second end 4 of the tested resistor Rx are two corresponding voltage test terminals.

The first end 1 of the first parasitic resistor Rc1 and the second end 2 of the second parasitic resistor Rc2 are two corresponding current test terminals.

In FIG. 1, a current source connected with the two current test terminals is illustrated and is used to provide test current Ix for the tested resistor Rx, the first parasitic resistor Rc1, and the second parasitic resistor Rc2 connected in series.

In FIG. 1, a voltmeter connected with the two voltage test terminals is further illustrated and is used to test voltage Vx.

During testing, current Ix is applied, voltage Vx is measured, and resistance Rx=Vx/Ix is obtained. Compared with a two-terminal method, the Kelvin structure reduces the interference of contact resistance and improves the test accuracy.

However, the test accuracy of small resistors is influenced by the error of a test loop itself, for example, a conducting wire or a probe card. According to circuit analysis, it can be seen that there is an error Voffset/I between the actual resistance value and the ideal resistance value. Voffset represents offset voltage in the test voltage Vx. A source of the offset voltage Voffset includes the error influence of the test loop itself, for example, the conducting wire or the probe card. With the gradual decrease of the resistance value of the tested resistor, the influence of the error on the test accuracy cannot be ignored.

In addition, transient voltage produced when a relay in the circuit is on and off causes short-term voltage drift, which also influences the test accuracy of small resistors.

Referring to FIG. 2, it is a test curve obtained by adopting the resistance test method using the existing Kelvin structure. Curve 102 corresponds to the true value curve of the tested resistor Rx. Curve 102 is a curve obtained after deducting the offset voltage Voffset, so it is a true value curve with the influence of offset voltage Voffset removed. Curve 101 is an ideal value curve corresponding to the tested resistor Rx when offset voltage Voffset is 0V, and the actual test value of the tested resistor Rx is the slope of curve 101. Therefore, it can be seen that, in the existing method, the actual test value of the tested resistor Rx is an ideal value, which cannot reflect the true value of the tested resistor Rx, so there is an error.

BRIEF SUMMARY

The technical problem to be solved by the disclosure is to provide a resistance test method using a Kelvin structure, which can reduce the resistance test error to make the test result close to the true value.

In order to solve the above technical problem, the resistance test method using the Kelvin structure includes the following steps:

step 1: providing a Kelvin test structure including a tested resistor, a first parasitic resistor, and a second parasitic resistor, a first end of the tested resistor being connected with a second end of the first parasitic resistor, and a second end of the tested resistor being connected with a first end of the second parasitic resistor;

the first end and the second end of the tested resistor being two corresponding voltage test terminals;

the first end of the first parasitic resistor and the second end of the second parasitic resistor being two corresponding current test terminals;

step 2: applying first current to the two current test terminals and simultaneously testing first voltage in the two voltage test terminals;

step 3: applying second current to the two current test terminals and simultaneously testing second voltage in the two voltage test terminals; the direction of the second current being opposite to the direction of the first current;

step 4: dividing a difference value obtained by subtracting the second voltage from the first voltage by a difference value between the first current and the second current to obtain the final test value of the tested resistor.

As a further improvement, the tested resistor is a small resistor with resistance less than 1 ohm.

As a further improvement, the tested resistor includes a polysilicon resistor, a diffused resistor, and a metal resistor.

As a further improvement, the tested resistor is integrated on a semiconductor substrate.

As a further improvement, the semiconductor substrate includes a silicon substrate.

As a further improvement, in step 2, there is a first error value in the first test value of the tested resistor obtained by dividing the first voltage by the first current;

in step 3, there is a second error value in the second test value of the tested resistor obtained by dividing the second voltage by the second current;

the first error value and the second error value are opposite in positivity and negativity, and are set off in step 4, such that the error value of the final test value of the tested resistor is reduced or eliminated.

As a further improvement, the absolute value of the second current is equal to the absolute value of the first current.

As a further improvement, a resistance test using the Kelvin structure is realized in a Wafer Acceptance Test (WAT).

As a further improvement, the two voltage test terminals are formed with pads and the two current test terminals are formed with pads.

As a further improvement, each pad is connected with probes on a probe card of a wafer acceptance tester.

As a further improvement, the first parasitic resistor is a parasitic resistor from the first end of the tested resistor to the current applying end of the wafer acceptance tester;

the second parasitic resistor is a parasitic resistor from the second end of the tested resistor to the current applying end of the wafer acceptance tester.

As a further improvement, a source of the first error value and the second error value includes an error caused by offset voltage formed by conducting wires and a probe card in a test loop.

As a further improvement, the source of the first error value and the second error value further includes an error caused by offset voltage corresponding to voltage drift formed at the two voltage test terminals by transient voltage produced when a relay in the wafer acceptance tester is on and off in the test process.

As a further improvement, the order of magnitude of the first error value and the second error value is equivalent to the order of magnitude of the final test value.

As a further improvement, all of the pads are formed by a front metal layer.

Under the condition of keeping the Kelvin test structure unchanged, the disclosure combines the current in the positive and negative directions to test, and takes the average value of the resistance values formed by the two tests as the final test value of the tested resistor. Since the offset voltage of the two test voltages formed by the test can set off each other, the resistance test error can be reduced to make the test result close to the true value.

BRIEF DESCRIPTION OF THE DRAWINGS

The disclosure will be further described below in detail in combination with the specific embodiments with reference to the drawings.

DETAILED DESCRIPTION OF THE DISCLOSURE

Figure 3:
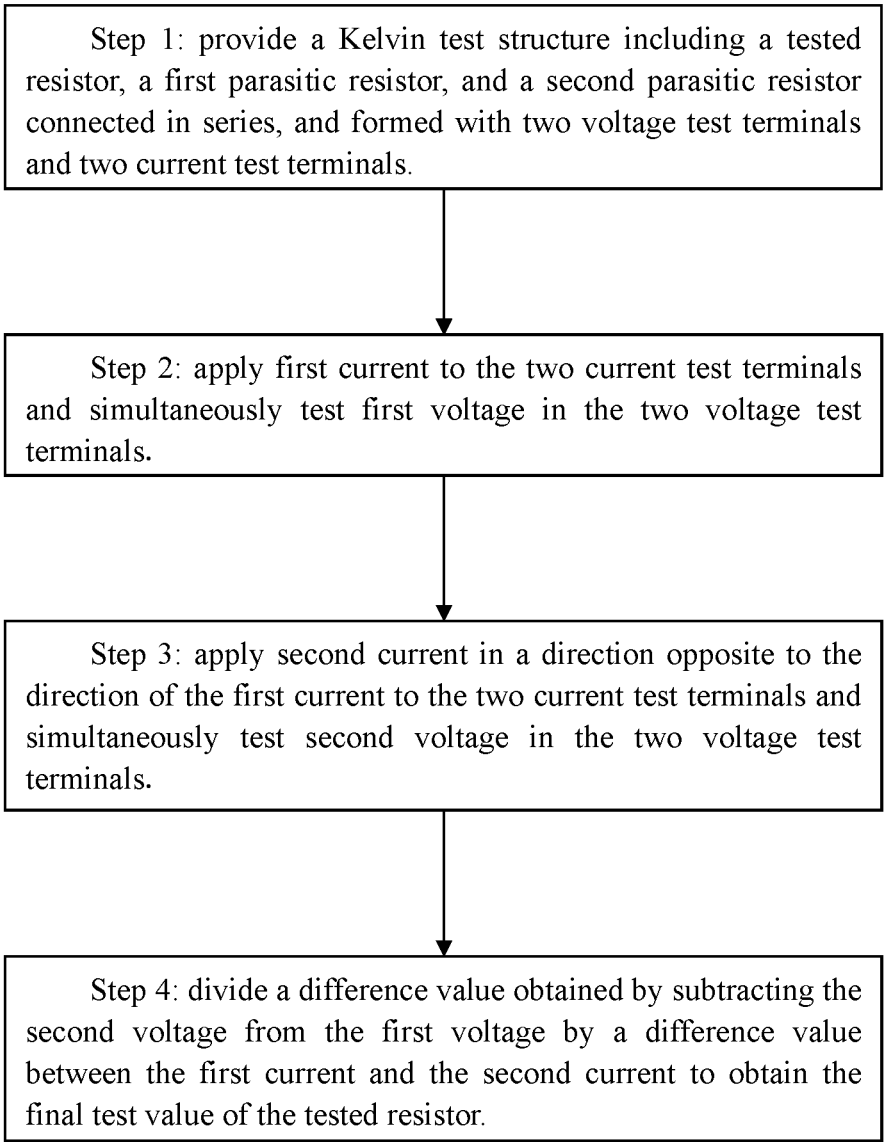
FIG. 3 is a flowchart of a resistance test method using a Kelvin structure according to one embodiment of the disclosure.
Figure 4:
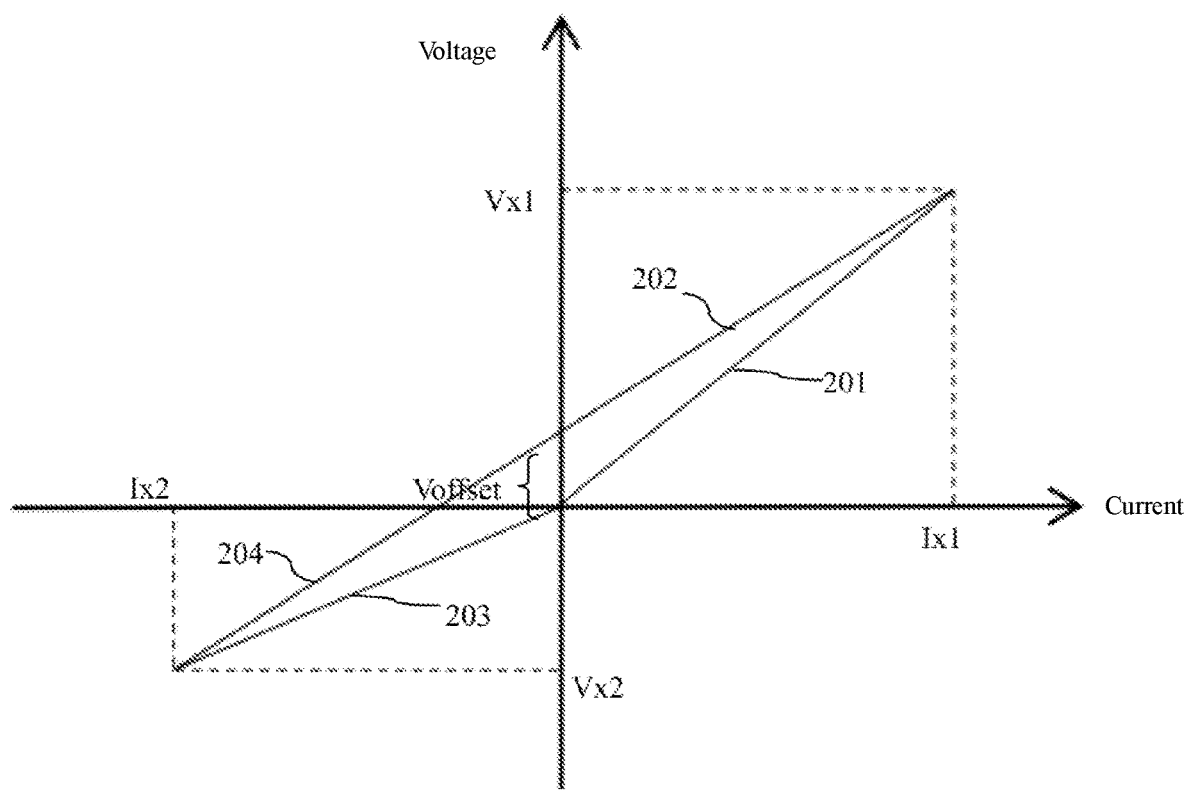
FIG. 4 is a test curve of the resistance test method using the Kelvin structure according to one embodiment of the disclosure.

Referring to FIG. 3, it is a flowchart of a resistance test method using a Kelvin structure according to one embodiment of the disclosure. Referring to FIG. 4, it is a test curve of the resistance test method using the Kelvin structure according to one embodiment of the disclosure. The resistance test method using the Kelvin structure according to one embodiment of the disclosure includes the following steps:

In step 1, a Kelvin test structure is provided and includes a tested resistor Rx, a first parasitic resistor Rc1, and a second parasitic resistor Rc2. A first end 3 of the tested resistor Rx is connected with a second end of the first parasitic resistor Rc1, and a second end 4 of the tested resistor Rx is connected with a first end of the second parasitic resistor Rc2.

The first end 3 and the second end 4 of the tested resistor Rx are two corresponding voltage test terminals.

The first end 1 of the first parasitic resistor Rc1 and the second end 2 of the second parasitic resistor Rc2 are two corresponding current test terminals.

Figure 1:
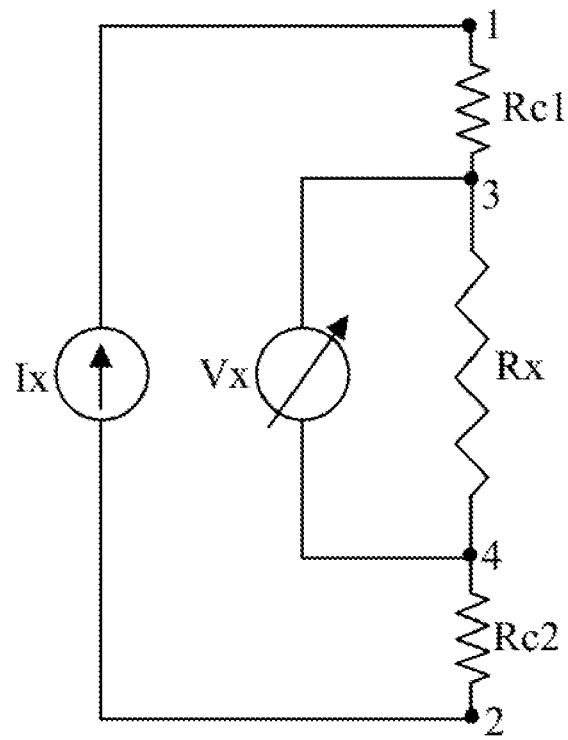
FIG. 1 is a schematic diagram of an existing Kelvin test structure.
Figure 2:
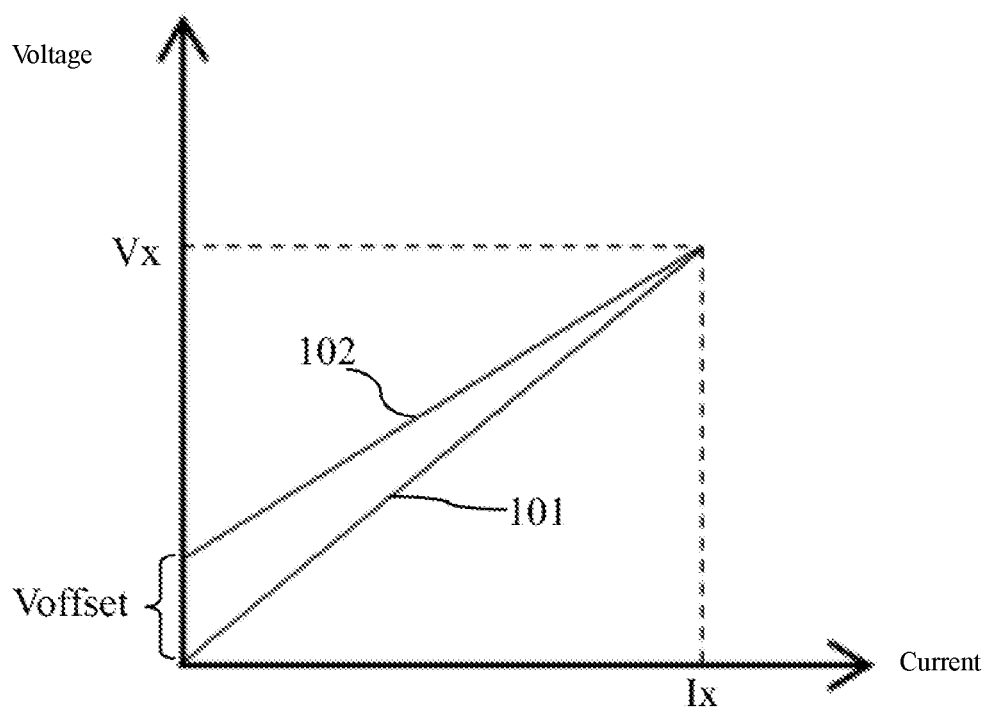
FIG. 2 is a test curve of a resistance test method using an existing Kelvin structure.

In FIG. 1, a current source connected with the two current test terminals are illustrated and are used to provide test current Ix for the tested resistor Rx, the first parasitic resistor Rc1 and the second parasitic resistor Rc2.

In FIG. 1, a voltmeter connected with the two voltage test terminals are further illustrated and are used to test voltage Vx.

In the method according to the embodiment of the disclosure, the tested resistor Rx is a small resistor with resistance less than 1 ohm.

The tested resistor Rx includes a polysilicon resistor, a diffused resistor, and a metal resistor.

The tested resistor Rx is integrated on a semiconductor substrate.

The semiconductor substrate includes a silicon substrate.

In step 2: first current I1 is applied to the two current test terminals and first voltage Vx1 is simultaneously tested in the two voltage test terminals.

There is a first error value in the first test value of the tested resistor Rx obtained by dividing the first voltage Vx1 by the first current I1.

From FIG. 4, it can be seen that curve 202 corresponds to the true value curve of the tested resistor Rx. However, since the first test value is the value obtained by dividing the first voltage Vx1 by the first current I1, the first test value is the slope corresponding to curve 201. Accordingly, it can be seen that the first test value is greater than the true value, so there is the first error value.

Curve 201 corresponds to the test curve when offset voltage Voffset is 0V, so curve 201 is an ideal curve. However, in fact, the offset voltage Voffset is not zero, so curve 202 is the curve corresponding to the true value. Obviously, through step 2, curve 202 cannot be obtained and only curve 201 can be obtained.

In step 3, second current I2 is applied to the two current test terminals and second voltage Vx2 is simultaneously tested in the two voltage test terminals. The direction of the second current I2 is opposite to the direction of the first current I1.

There is a second error value in the second test value of the tested resistor Rx obtained by dividing the second voltage Vx2 by the second current I2.

From FIG. 4, it can be seen that curve 204 corresponds to the true value curve of the tested resistor Rx. However, since the second test value is the value obtained by dividing the second voltage Vx2 by the second current I2, the second test value is the slope corresponding to curve 203. Accordingly, it can be seen that the second test value is smaller than the true value, so there is the second error value.

Curve 203 corresponds to the test curve when offset voltage Voffset is 0V, so curve 203 is an ideal curve. However, in fact, the offset voltage Voffset is not zero, so curve 204 is the curve corresponding to the true value. Obviously, through step 3, curve 204 cannot be obtained and only curve 203 can be obtained.

In the method according to the embodiment of the disclosure, the absolute value of the second current I2 is equal to the absolute value of the first current I1. In the method according to other embodiments, the absolute value of the second current I2 may be greater than or smaller than the absolute value of the first current I1.

In step 4, a difference value obtained by subtracting the second voltage Vx2 from the first voltage Vx1 is divided by a difference value between the first current I1 and the second current I2 to obtain the final test value of the tested resistor Rx.

The first error value and the second error value are opposite in positivity and negativity, and are set off in step 4, such that the error value of the final test value of the tested resistor Rx is reduced or eliminated.

From FIG. 4, it can be seen that, since the offset voltage Voffset remains unchanged, the curve corresponding to the final test value obtained by averaging the first test value and the second test value is the curve formed by connecting curve 202 and curve 204. Referring to FIG. 4, it can be seen that curve 204 is an extension line of curve 202. Obviously, curve 202 is a curve corresponding to the final test value, so the final test value is no longer the test value corresponding to the ideal state when the offset voltage Voffset is 0V, but reflects the offset voltage Voffset and the true value formed after the influence of the offset voltage Voffset is removed.

In the method according to the embodiment of the disclosure, a resistance test using the Kelvin structure is realized in a wafer acceptance test.

The two voltage test terminals are formed with pads and the two current test terminals are formed with pads.

Each pad is connected with probes on a probe card of a wafer acceptance tester.

The first parasitic resistor Rc1 is a parasitic resistor from the first end 3 of the tested resistor Rx to the current applying end of the wafer acceptance tester.

The second parasitic resistor Rc2 is a parasitic resistor from the second end 4 of the tested resistor Rx to the current applying end of the wafer acceptance tester.

A source of the first error value and the second error value includes an error caused by offset voltage formed by conducting wires and a probe card in a test loop.

The source of the first error value and the second error value further includes an error caused by offset voltage corresponding to voltage drift formed at the two voltage test terminals by transient voltage produced when a relay in the wafer acceptance tester is on and off in the test process.

The order of magnitude of the first error value and the second error value is equivalent to the order of magnitude of the final test value.

All of the pads are formed by a front metal layer.

Under the condition of keeping the Kelvin test structure unchanged, the embodiment of the disclosure combines the current in the positive and negative directions to test, and takes the average value of the resistance values formed by the two tests as the final test value of the tested resistor Rx. Since the offset voltage of the two test voltages formed by the test can set off each other, the resistance test error can be reduced to make the test result close to the true value.

The disclosure has been described above in detail through the specific embodiments, which, however, do not constitute restrictions on the disclosure. Without departing from the principle of the disclosure, those skilled in the art may also make many modifications and improvements, which should also be regarded as included the protection scope of the disclosure.

What is claimed is:

1. A resistance test method using a Kelvin test structure, the resistance test method comprising:

step 1: providing the Kelvin test structure comprising a tested resistor, a first parasitic resistor, and a second parasitic resistor, a first end of the tested resistor being connected with a second end of the first parasitic resistor, and a second end of the tested resistor being connected with a first end of the second parasitic resistor;

the tested resistor is a small resistor with resistance less than 1 ohm;

the tested resistor is integrated on a semiconductor substrate;

the first end and the second end of the tested resistor being two corresponding voltage test terminals;

a first end of the first parasitic resistor and a second end of the second parasitic resistor being two corresponding current test terminals;

step 2: applying a first current to the two current test terminals and simultaneously testing a first voltage in the two voltage test terminals;

step 3: applying a second current to the two current test terminals and simultaneously testing a second voltage in the two voltage test terminals; the direction of the second current being opposite to the direction of the first current; and step 4: dividing a difference value obtained by subtracting the second voltage from the first voltage by a difference value between the first current and the second current to obtain the final test value of the tested resistor.

2. The resistance test method using the Kelvin test structure according to claim 1, wherein the tested resistor comprises at least one of a polysilicon resistor, a diffused resistor, and a metal resistor.

3. The resistance test method using the Kelvin test structure according to claim 1, wherein the semiconductor substrate comprises a silicon substrate.

4. The resistance test method using the Kelvin test structure according to claim 3, wherein in step 2, there is a first error value in the first test value of the tested resistor obtained by dividing the first voltage by the first current;

wherein in step 3, there is a second error value in the second test value of the tested resistor obtained by dividing the second voltage by the second current; and wherein the first error value and the second error value are opposite in positivity and negativity, and are set off in step 4, such that the error value of the final test value of the tested resistor is reduced or eliminated.

5. The resistance test method using the Kelvin test structure according to claim 4, wherein the absolute value of the second current is equal to the absolute value of the first current.

6. The resistance test method using the Kelvin test structure according to claim 4, wherein a resistance test using the Kelvin test structure is realized in a wafer acceptance test.

7. The resistance test method using the Kelvin test structure according to claim 6, wherein the two voltage test terminals are formed with pads and the two current test terminals are formed with pads.

8. The resistance test method using the Kelvin test structure according to claim 7, wherein each pad is connected with probes on a probe card of a wafer acceptance tester.

9. The resistance test method using the Kelvin test structure according to claim 8, wherein the first parasitic resistor is a parasitic resistor from the first end of the tested resistor to the current applying end of the wafer acceptance tester; and wherein the second parasitic resistor is a parasitic resistor from the second end of the tested resistor to the current applying end of the wafer acceptance tester.

10. The resistance test method using the Kelvin test structure according to claim 9, wherein a source of the first error value and the second error value comprises an error caused by offset voltage formed by conducting wires and a probe card in a test loop.

11. The resistance test method using the Kelvin test structure according to claim 10, wherein the source of the first error value and the second error value further comprises an error caused by offset voltage corresponding to voltage drift formed at the two voltage test terminals by transient voltage produced when a relay in the wafer acceptance tester is on and off in the test process.

12. The resistance test method using the Kelvin test structure according to claim 11, wherein the order of magnitude of the first error value and the second error value is equivalent to the order of magnitude of the final test value.

13. The resistance test method using the Kelvin test structure according to claim 7, wherein all of the pads are formed by a front metal layer.

* * * * *